(12) United States Patent
Ishiguro et al.

(10) Patent No.: US 11,075,508 B2
(45) Date of Patent: Jul. 27, 2021

(54) THERMAL-INSULATED MULTI-WALLED PIPE FOR SUPERCONDUCTING POWER TRANSMISSION AND LAYING METHOD THEREFOR

(71) Applicant: JFE STEEL CORPORATION, Tokyo (JP)

(72) Inventors: Yasuhide Ishiguro, Tokyo (JP); Akio Sato, Tokyo (JP); Shigeto Sakashita, Tokyo (JP)

(73) Assignee: JFE STEEL CORPORATION, Tokyo (JP)

( * ) Notice: Subject to any disclaimer, the term of this patent is extended or adjusted under 35 U.S.C. 154(b) by 0 days.

(21) Appl. No.: 16/612,778

(22) PCT Filed: May 29, 2018

(86) PCT No.: PCT/JP2018/020585
§ 371 (c)(1),
(2) Date: Nov. 12, 2019

(87) PCT Pub. No.: WO2018/221524
PCT Pub. Date: Dec. 6, 2018

(65) Prior Publication Data
US 2020/0220340 A1    Jul. 9, 2020

(30) Foreign Application Priority Data

May 31, 2017  (JP) .............................. JP2017-107845

(51) Int. Cl.
*H02G 3/04*    (2006.01)
*F16L 1/16*    (2006.01)
(Continued)

(52) U.S. Cl.
CPC .............. *H02G 3/0481* (2013.01); *F16L 1/16* (2013.01); *F16L 1/235* (2013.01); *F16L 9/18* (2013.01); *F16L 59/075* (2013.01); *H01B 12/00* (2013.01)

(58) Field of Classification Search
CPC combination set(s) only.
See application file for complete search history.

(56) References Cited

U.S. PATENT DOCUMENTS 6,176,269 B1 * 1/2001 Jarvenkyla .......... B29C 48/3366
                                                         138/143
8,037,705 B2   10/2011 Schmidt et al.
(Continued)

FOREIGN PATENT DOCUMENTS

CN    101136266 B    11/2011
CN    103262178 A     8/2013
(Continued)

OTHER PUBLICATIONS

Aug. 21, 2018, International Search Report issued in the International Patent Application No. PCT/JP2018/020585.
(Continued)

*Primary Examiner* — William H. Mayo, III
*Assistant Examiner* — Krystal Robinson
(74) *Attorney, Agent, or Firm* — Kenja IP Law PC

(57) ABSTRACT

A thermal-insulated multi-walled pipe for superconducting power transmission comprises: a superconducting cable; a multi-walled pipe composed of a plurality of straight pipes and houses the superconducting cable; and a plurality of spacers that are located between adjacent two straight pipes of the plurality of straight pipes, wherein a cross-sectional shape of each spacer is a polygon having three or more vertices, each spacer has a through-hole at a center in the plane, an inner straight pipe is located to pass through the
(Continued)

through-hole, a frictional coefficient $\mu_i$ between each spacer and the inner straight pipe is 0.1 or less, a frictional coefficient $\mu_o$ between each spacer and an outer straight pipe is 0.1 or less, and a ratio $L_d/d$ of a diagonal equivalent length $L_d$ of the polygon to an inner diameter d of the outer straight pipe of the adjacent two straight pipes is 0.9 or less.

8 Claims, 3 Drawing Sheets

(51) Int. Cl.
  *F16L 1/235* (2006.01)
  *F16L 9/18* (2006.01)
  *F16L 59/075* (2006.01)
  *H01B 12/00* (2006.01)

(56) References Cited

U.S. PATENT DOCUMENTS

| | | | |
|---|---|---|---|
| 9,318,242 B2 | 4/2016 | Yamaguchi et al. | |
| 2002/0139115 A1* | 10/2002 | Sugaya | F01N 13/14 60/323 |
| 2003/0167728 A1* | 9/2003 | Mohlenhoff | E04G 23/0218 52/742.16 |
| 2005/0121903 A1* | 6/2005 | Offredi | F16L 59/143 285/123.2 |
| 2010/0098891 A1* | 4/2010 | Grieser-Schmitz | C08G 18/6674 428/36.5 |
| 2010/0126250 A1* | 5/2010 | Jax | G01M 3/222 73/40.5 R |
| 2013/0026685 A1* | 1/2013 | Maias | F27D 7/06 266/44 |
| 2014/0305517 A1* | 10/2014 | Adler | G01M 3/00 137/312 |

FOREIGN PATENT DOCUMENTS

| | | | | |
|---|---|---|---|---|
| DE | 20312533 U1 | 10/2003 | | |
| GB | 1418759 A | * | 12/1975 | F16L 1/165 |
| JP | S5794780 U | 6/1982 | | |
| JP | H06325629 A | 11/1994 | | |
| JP | H087670 A | 1/1996 | | |
| JP | 2007080649 A | * | 3/2007 | H01B 12/16 |
| JP | 2007080649 A | 3/2007 | | |
| JP | 2011231917 A | 11/2011 | | |
| JP | 2015161010 A | 9/2015 | | |
| KR | 101384704 B1 | 4/2014 | | |

OTHER PUBLICATIONS

Jun. 25, 2019, Notification of Reasons for Refusal issued by the Japan Patent Office in the corresponding Japanese Patent Application No. 2018-549992 with English language.

Aug. 7, 2020, Office Action issued by the China National Intellectual Property Administration in the corresponding Chinese Patent Application No. 201880032014.8 with English language search report.

Apr. 14, 2020, the Extended European Search Report issued by the European Patent Office in the corresponding European Patent Application No. 18809394.2.

Feb. 15, 2021, Office Action issued by the Korean Intellectual Property Office in the corresponding Korean Patent Application No. 10-2019-7037719 with English language.

Nov. 17, 2020, Communication pursuant to Article 94(3) EPC issued by the European Patent Office in the corresponding European Patent Application No. 18809394.2.

* cited by examiner

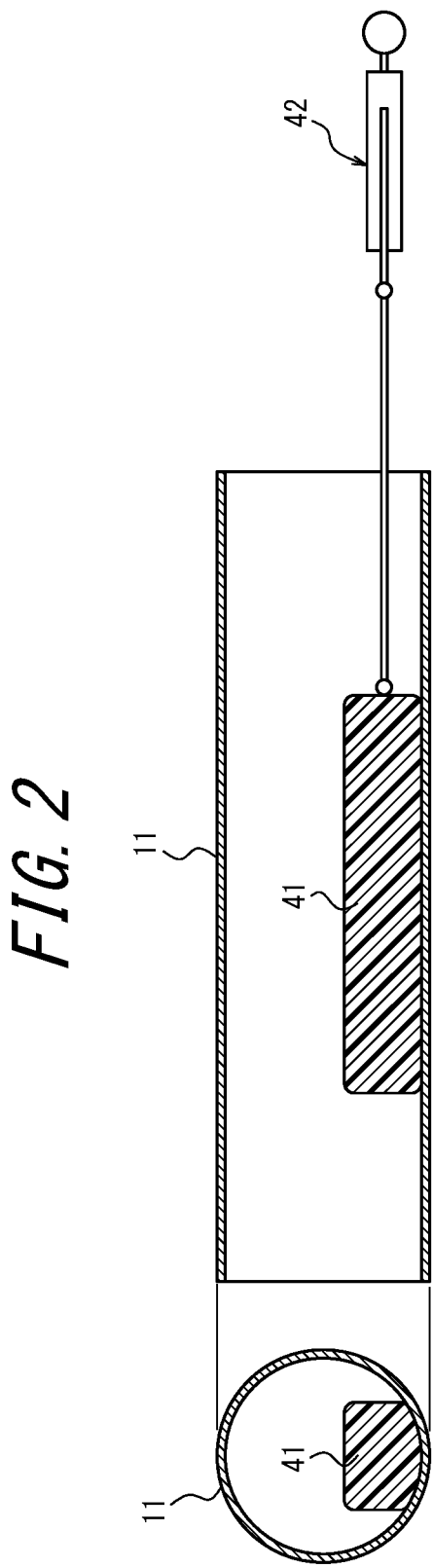

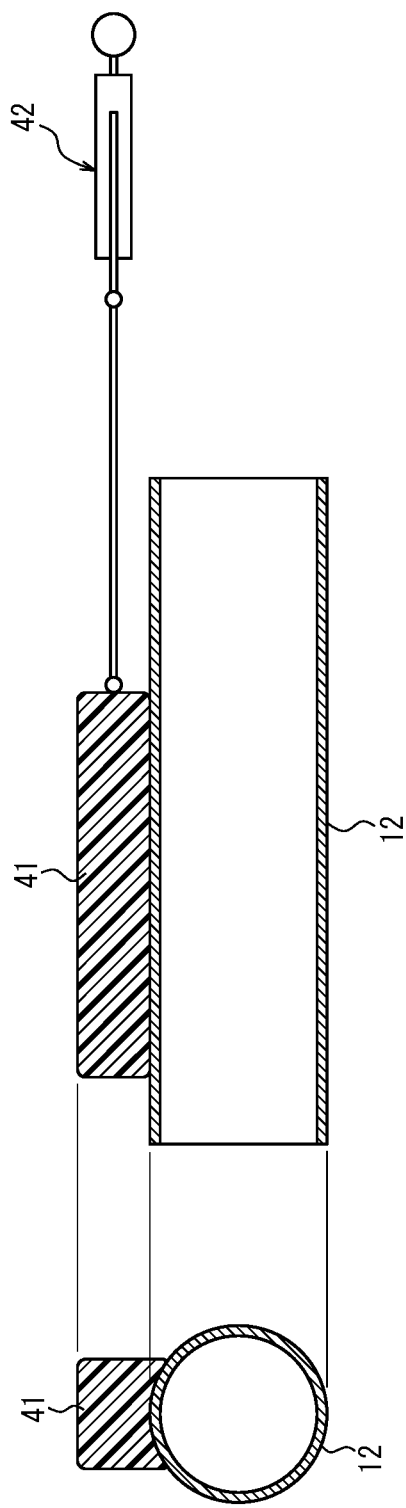

THERMAL-INSULATED MULTI-WALLED PIPE FOR SUPERCONDUCTING POWER TRANSMISSION AND LAYING METHOD THEREFOR

TECHNICAL FIELD

The present disclosure relates to a thermal-insulated multi-walled pipe for superconducting power transmission (a thermal-insulated multiple pipe for superconducting power transmission), and particularly relates to a thermal-insulated multi-walled pipe for superconducting power transmission suitable for laying on the sea bottom using a reel barge. The present disclosure also relates to a laying method for the thermal-insulated multi-walled pipe for superconducting power transmission.

BACKGROUND

Superconductivity is a phenomenon in which, when a metal, an alloy, or the like is cooled, its electric resistance rapidly decreases to zero at a specific temperature. Applications of superconductivity are studied in various fields. In particular, superconducting power transmission, i.e. power transmission using a cable in a superconducting state, is proceeding toward practical utilization as a power transmission method with no power loss during power transmission.

In superconducting power transmission, to maintain a cable in a superconducting state, the cable needs to be constantly cooled. Hence, the use of a thermal-insulated multi-walled pipe is proposed. In the thermal-insulated multi-walled pipe, a cable of a superconducting material is placed in the innermost pipe (inner pipe) of the multi-walled pipe, and a coolant such as liquid nitrogen is flown into the inner pipe. Moreover, to prevent a temperature elevation caused by external heat, a vacuum insulation layer is provided by creating a vacuum between adjacent two pipes (inner pipe and outer pipe) to block heat from entering the thermal-insulated multi-walled pipe.

Even in the case where the thermal-insulated multi-walled pipe having the above-described structure is used, however, if pipes forming the multi-walled pipe come into direct contact with each other, heat directly enters the thermal-insulated multi-walled pipe through the contact portion by thermal (heat) conduction, as a result of which the thermal insulation property decreases.

JP 2007-080649 A (PTL 1) proposes providing a spacer made of a low thermal conductive material between an inner pipe and an outer pipe. By using the spacer, the inner pipe and the outer pipe are kept from being in contact with each other, so that intrusion of external heat can be prevented.

JP H08-007670 A (PTL 2) proposes a thermal-insulated multi-walled pipe for superconducting power transmission having flexibility by using corrugate pipes as an inner pipe and an outer pipe, in terms of making the pipe flexible.

CITATION LIST

Patent Literatures

PTL 1: JP 2007-080649 A
PTL 2: JP H08-007670 A

SUMMARY

Technical Problem

To use a thermal-insulated multi-walled pipes for superconducting power transmission such as those described above for actual power transmission, a method of efficiently laying the multi-walled pipe over a long distance, in particular a method of laying the multi-walled pipe on the sea bottom, is required.

One method of laying the pipe on the sea bottom is reel-lay that employs a reel barge used when laying petroleum line pipes and the like. The reel barge is a pipe laying barge including a large-diameter reel, and lays, on the sea bottom, a pipe wound around the reel beforehand while unwinding the pipe at sea.

However, in the case of laying the conventional thermal-insulated multi-walled pipe described in PTL 1 by reel-lay, the spacer located between the pipes is damaged.

Moreover, in the case of the multi-walled pipe including corrugate pipes described in PTL 2, the multi-walled pipe can be laid easily because the pipe has flexibility, but sufficient thermal insulation property cannot be obtained.

It could therefore be helpful to provide a thermal-insulated multi-walled pipe for superconducting power transmission that suffers no damage to its spacers even when laid by reel-lay, having high thermal insulation property. It could also be helpful to provide a laying method for the thermal-insulated multi-walled pipe for superconducting power transmission.

Solution to Problem

We provide the following.

1. A thermal-insulated multi-walled pipe for superconducting power transmission, comprising: a superconducting cable; a multi-walled pipe that is composed of a plurality of straight pipes and houses the superconducting cable; and a plurality of spacers that are located between adjacent two straight pipes of the plurality of straight pipes, wherein a cross-sectional shape of each of the plurality of spacers in a plane perpendicular to a longitudinal direction of the thermal-insulated multi-walled pipe for superconducting power transmission is a polygon having three or more vertices, each of the plurality of spacers has a through-hole at a center in the plane perpendicular to the longitudinal direction of the thermal-insulated multi-walled pipe for superconducting power transmission, an inner straight pipe of the adjacent two straight pipes is located to pass through the through-hole, a frictional coefficient $\mu_i$ between each of the plurality of spacers and the inner straight pipe of the adjacent two straight pipes is 0.1 or less, a frictional coefficient $\mu_o$ between each of the plurality of spacers and an outer straight pipe of the adjacent two straight pipes is 0.1 or less, and a ratio $L_d/d$ of a diagonal equivalent length $L_d$ of the polygon to an inner diameter d of the outer straight pipe of the adjacent two straight pipes is 0.9 or less.

2. The thermal-insulated multi-walled pipe for superconducting power transmission according to 1., wherein a length $L_1$ of a contact portion between each of the plurality of spacers and the outer straight pipe of the adjacent two straight pipes in a longitudinal direction of the straight pipe is 5 mm or less.

3. The thermal-insulated multi-walled pipe for superconducting power transmission according to 1. or 2., wherein a total thickness of the plurality of straight pipes constituting the multi-walled pipe is 10 mm or more.

4. The thermal-insulated multi-walled pipe for superconducting power transmission according to any one of 1. to 3., wherein an innermost pipe of the plurality of straight pipes is made of a steel material whose volume fraction of austenite phase is 80% or more.

5. The thermal-insulated multi-walled pipe for superconducting power transmission according to any one of 1. to 4., wherein at least one of the plurality of straight pipes has a plated layer.

6. A laying method for a thermal-insulated multi-walled pipe for superconducting power transmission, comprising laying the thermal-insulated multi-walled pipe for superconducting power transmission according to any one of 1. to 5. on a sea bottom using a reel barge.

Advantageous Effect

It is thus possible to provide a thermal-insulated multi-walled pipe for superconducting power transmission that can be efficiently laid on the sea bottom because, even when the thermal-insulated multi-walled pipe for superconducting power transmission is laid by reel-lay, its spacers are not damaged. The thermal-insulated multi-walled pipe for superconducting power transmission also has excellent thermal insulation property when compared with thermal-insulated multi-walled pipes including corrugate pipes or flexible pipes.

BRIEF DESCRIPTION OF THE DRAWINGS

In the accompanying drawings:

FIG. 2 is a schematic diagram illustrating a measurement method for a frictional coefficient $\mu_o$; and FIG. 3 is a schematic diagram illustrating a measurement method for a frictional coefficient $\mu_i$.

DETAILED DESCRIPTION

Figure 1:
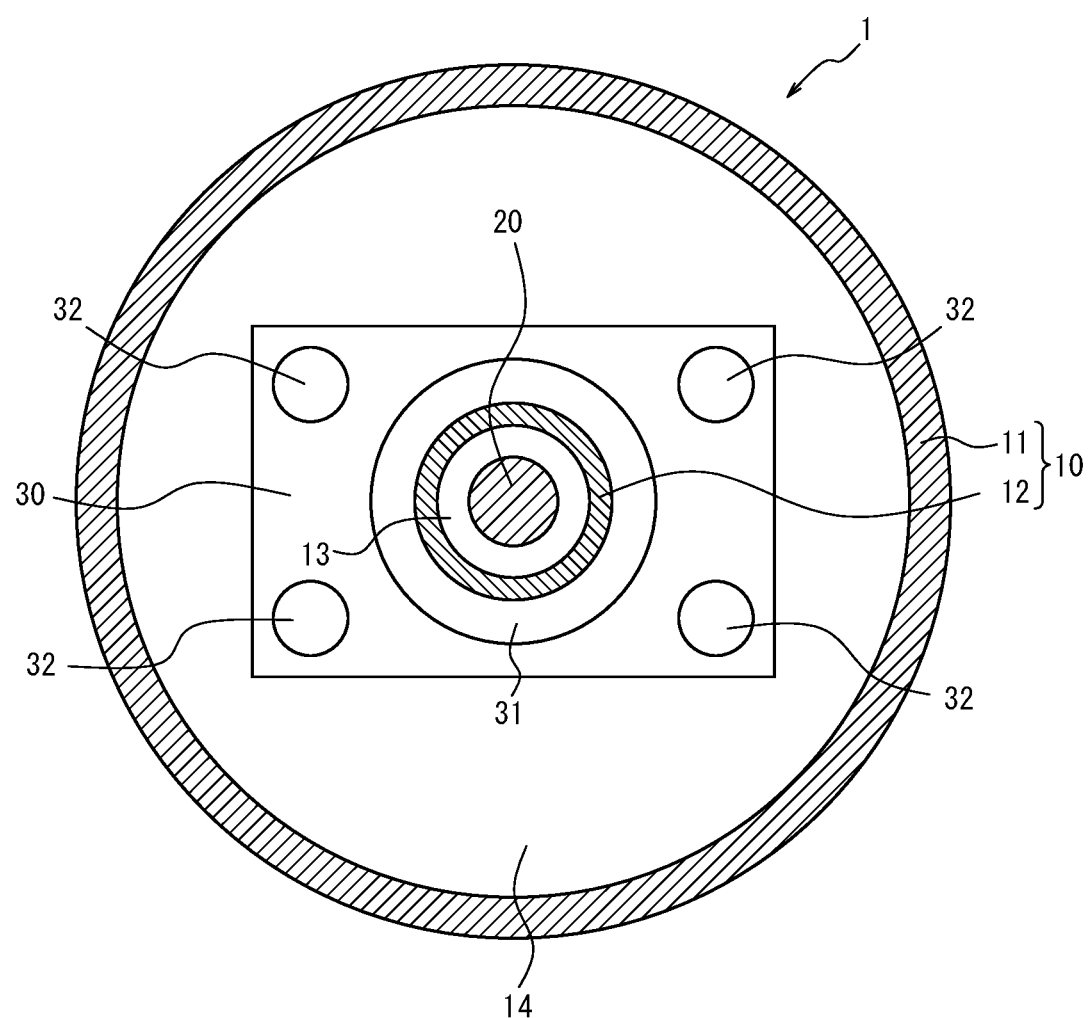
FIG. 1 is a schematic sectional diagram of a thermal-insulated multi-walled pipe for superconducting power transmission according to one of the disclosed embodiments.

A method according to one of the disclosed embodiments will be described in detail below. The following description merely concerns one of the preferred embodiments according to the present disclosure, and the present disclosure is not limited by the following description.

A thermal-insulated multi-walled pipe for superconducting power transmission according to the present disclosure includes a superconducting cable, a multi-walled pipe that houses the superconducting cable, and a plurality of spacers. The structure of each component will be described below.

[Superconducting Cable]

The superconducting cable may be any cable that can be used for superconducting power transmission. An example of a superconducting cable suitable for such use is a superconducting cable including a core (former) made of a metal such as copper, an insulation layer, and a conductor made of a superconducting material. The superconducting material may be any kind of superconducting material, but is preferably a high-temperature superconducting material that is in a superconducting state in a liquid nitrogen environment.

[Multi-Walled Pipe]

The superconducting cable is housed in the multi-walled pipe composed of a plurality of straight pipes. The multi-walled pipe may be a double pipe composed of two straight pipes, or of three or more straight pipes. The superconducting cable is typically housed inside the innermost pipe of the plurality of straight pipes constituting the multi-walled pipe. When actually using the thermal-insulated multi-walled pipe for superconducting power transmission, a coolant for the superconducting cable is flown into the pipe (typically, the innermost pipe) housing the superconducting cable. As the coolant, for example, liquid nitrogen may be used.

In the present disclosure, it is important that the multi-walled pipe is a combination of straight pipes, without using corrugate pipes or flexible pipes. A straight pipe has a smaller surface area per unit length than a corrugate pipe or a flexible pipe, and therefore can prevent intrusion of external heat. The term "straight pipe" herein denotes a pipe which is not formed in a wave shape such as a corrugate pipe or a flexible pipe but a pipe having a substantially constant cross-sectional area, including a straight pipe subjected to bending. The shape of a cross-section perpendicular to the longitudinal direction of the straight pipe is preferably circular.

The material of each straight pipe is not limited, but is preferably a metal. As the metal, for example, one or more selected from the group consisting of aluminum, an aluminum alloy, iron, steel, a Ni-based alloy, and a Co-based alloy is preferably used. In particular, a straight steel pipe is preferred for the straight pipe, in terms of strength, corrosion resistance, cost, etc. One or both of carbon steel and stainless steel are preferred for the material of the straight steel pipe. The plurality of straight pipes constituting the multi-walled pipe may be made of the same material or different materials.

The innermost pipe of the plurality of straight pipes constituting the multi-walled pipe is preferably made of a steel material whose volume fraction of austenite phase is 80% or more. When winding the multi-walled pipe around a reel barge, the innermost pipe of the plurality of straight pipes constituting the multi-walled pipe is deformed most, due to the differences in bending radius. A steel material whose volume fraction of austenite phase is 80% or more has excellent elongation, and is therefore suitable as the material for the innermost pipe. Moreover, since the innermost pipe contacts with the coolant of low temperature, a steel material whose volume fraction of austenite phase is 80% or more is suitable in terms of strength and toughness at low temperature. The steel material whose volume fraction of austenite phase is 80% or more may be any steel material satisfying the condition.

The volume fraction of austenite is preferably 90% or more. No upper limit is placed on the volume fraction of austenite, and the upper limit may be 100%. Examples of the steel material whose volume fraction of austenite phase is 80% or more include austenitic stainless steel and an austenitic steel material containing Mn (i.e. high manganese steel). The Mn content in the high manganese steel is preferably 11 mass % or more. As the austenitic stainless steel, SUS316L is preferable.

As each straight pipe, a pipe produced by any method may be used. Examples of pipes suitable for use include an electric-resistance-welded pipe, a seamless pipe, and a UOE pipe. The straight pipe may be optionally subjected to a surface treatment. As the surface treatment, for example, one or more selected from the group consisting of pickling, electropolishing, chemical polishing, and plating is preferably performed. Plating will be described later.

Total Thickness

The thickness of each of the plurality of straight pipes constituting the multi-walled pipe may independently be any value. The total thickness of the plurality of straight pipes is preferably 10 mm or more, and more preferably 15 mm or more. If the total thickness is in such a range, when laying the thermal-insulated multi-walled pipe for superconducting power transmission on the sea bottom, the thermal-insulated multi-walled pipe for superconducting power transmission sinks under its own weight. Thus, the thermal-insulated multi-walled pipe for superconducting power transmission can be laid easily without using a weight and the like, and has such strength that can withstand water pressure and the like.

The thickness of each of the plurality of straight pipes constituting the multi-walled pipe is not limited, but is preferably 3 mm or more. The thickness of the outermost pipe of the plurality of straight pipes constituting the multi-walled pipe is more preferably 8 mm or more.

Plated Layer

A plated layer is preferably provided on the surface of the straight pipe. By providing the plated layer, not only corrosion resistance can be improved, but also emissivity (radiation factor) can be reduced to further prevent intrusion of external heat. In the case of forming the plated layer, the plated layer is provided on at least one of the plurality of straight pipes constituting the multi-walled pipe. The plated layer may be provided on all of the plurality of straight pipes constituting the multi-walled pipe. Each straight pipe may have the plated layer on one or both of its outer surface and inner surface.

The material of the plated layer is not limited, and may be any kind of metal. Examples of the metal include zinc, a zinc alloy, aluminum, and an aluminum alloy. Since the outermost pipe contacts with the external corrosive environment, a plated layer made of a metal having a sacrificial protection effect is preferably provided on the outer surface of the outermost pipe, in terms of improving corrosion resistance. Examples of the metal having a sacrificial protection effect include zinc and a zinc alloy. Examples of the method of forming the plated layer include hot dip plating and electroplating.

Coating

A coating may be optionally provided at the outer surface of the outermost pipe, to protect the outermost pipe. The material of the coating is not limited, and may be, for example, a resin. As the resin, fluororesin such as polytetrafluoroethylene and silicone resin are preferably used. The method of forming the coating is not limited. For example, the coating can be formed by winding tape made of a resin or the like around the outer surface of the outermost pipe.

[Spacer]

A plurality of spacers are located between adjacent two straight pipes of the plurality of straight pipes constituting the multi-walled pipe. By providing the spacers, the adjacent two pipes are kept from being in direct contact with each other, so that direct heat conduction can be prevented. The term "adjacent" herein denotes a state in which one of two pipes is located inside the other one of the two pipes and there is no other pipe between the two pipes.

The cross-sectional shape of each spacer in a plane perpendicular to the longitudinal direction of the thermal-insulated multi-walled pipe for superconducting power transmission is a polygon. The polygon may be any polygon with three or more vertices. Examples include a triangle, a quadrangle, a pentagon, and a hexagon. The polygon is not limited to a regular polygon. For example, as the quadrangle, not only a square but also a rectangle whose long side and short side differ in length may be used. The term "polygon" herein includes not only a geometrically perfect polygon but also a substantial polygon obtained by applying a minor change to a perfect polygon. For example, the shape of the spacer is regarded as the polygon herein even in the case where the corners of the spacer are round or flat due to wear, deformation, or the like.

FIG. 1 is a schematic diagram illustrating a cross-sectional structure of a thermal-insulated multi-walled pipe 1 for superconducting power transmission according to one of the disclosed embodiments. In this example, a double pipe 10 composed of an outer pipe 11 and an inner pipe 12 is used as a multi-walled pipe, and the outer pipe 11 and the inner pipe 12 are both straight pipes. A superconducting cable 20 is housed inside the inner pipe 12. When using the thermal-insulated multi-walled pipe 1 for superconducting power transmission, a coolant is flown into a space 13 inside the inner pipe 12. When using the thermal-insulated multi-walled pipe 1 for superconducting power transmission, a space 14 between the outer pipe 11 and the inner pipe 12 is brought into a vacuum state, and functions as a vacuum insulation layer.

A spacer 30 is located in the space 14 between the outer pipe 11 and the inner pipe 12. In the example in FIG. 1, the cross-sectional shape of the spacer 30 in a plane perpendicular to the longitudinal direction of the thermal-insulated multi-walled pipe 1 for superconducting power transmission is a rectangle, and the spacer 30 has a through-hole 31 at its center. The inner pipe 12 is located to pass through the through-hole 31. Although only one spacer 30 is illustrated in FIG. 1, actually a plurality of spacers are arranged at spacing in the longitudinal direction of the thermal-insulated multi-walled pipe 1 for superconducting power transmission. The spacing is not limited, but is preferably regular spacing. The plurality of spacers may have different shapes, but preferably have the same shape.

The spacer 30 may have one or more through-holes 32 besides the through-hole 31 at the center. With the through-holes 32, intrusion of heat due to heat conduction of the spacer 30 can be prevented.

Frictional Coefficient

If the frictional coefficient between the spacer and the pipe in contact with the spacer is large, the spacer may crack without sliding when winding the thermal-insulated multi-walled pipe for superconducting power transmission around a reel or unwinding the wound thermal-insulated multi-walled pipe for superconducting power transmission from the reel to lay the thermal-insulated multi-walled pipe by reel-lay. Hence, the frictional coefficient between the spacer and the inner straight pipe of the adjacent two straight pipes is set to 0.1 or less. Likewise, the frictional coefficient $\mu_o$ between the spacer and the outer straight pipe of the adjacent two straight pipes is set to 0.1 or less.

The frictional coefficient $\mu_o$ can be measured by the following method. FIG. 2 is a schematic diagram illustrating a method of measuring the frictional coefficient $\mu_o$ between the outer straight pipe (outer pipe 11) of the adjacent two straight pipes and the spacer. In the measurement, instead of the actual spacer, a frictional coefficient measurement jig 41 made of the same material as the spacer and having the same surface roughness as the spacer is used. The jig 41 has a width of 5 cm, a height of 5 cm, and a length of 40 cm, and the lower surface (the surface in contact with the outer pipe 11) of the jig 41 has the same curvature as the inner surface of the outer pipe 11. In the case where the diameter of the outer pipe 11 is 80 mm or less, the size of the jig 41 is adjusted depending on the size of the outer pipe 11.

The jig 41 is placed inside the outer pipe 11, as illustrated in FIG. 2. A spring scale 42 connected to the jig 41 is horizontally pulled at a moving speed of 150 mm/min, and a load T (N) when the jig 41 starts to move is measured. A frictional coefficient $\mu$ can be calculated according to the following Formula (1), using the measured load T (N). the mass M (kg) of the jig 41 and gravitational acceleration G (m/s²):

$$\mu=T/(G\times M) \quad (1).$$

The measurement is performed at three points apart from each other by 120° in the circumferential direction of the pipe, and an average value of the frictional coefficients μ at the three points is taken to be $\mu_o$.

The frictional coefficient can be measured by the same method as $\mu_o$. FIG. 3 is a schematic diagram illustrating a method of measuring the frictional coefficient $\mu_i$ between the inner straight pipe (inner pipe 12) of the adjacent two straight pipes and the spacer. In the measurement, instead of the actual spacer, a frictional coefficient measurement jig 41 made of the same material as the spacer and having the same surface roughness as the spacer is used. The jig 41 has a width of 5 cm, a height of 5 cm, and a length of 40 cm, and the lower surface (the surface in contact with the inner pipe 12) of the jig 41 has the same curvature as the outer surface of the inner pipe 12. In the case where the diameter of the inner pipe 12 is 80 mm or less, the size of the jig 41 is adjusted depending on the size of the inner pipe 12.

The jig 41 is placed outside the inner pipe 12, as illustrated in FIG. 3. A spring scale 42 connected to the jig 41 is horizontally pulled at a moving speed of 150 mm/min, and a load T (N) when the jig 41 starts to move is measured. A frictional coefficient μ can be calculated according to the following Formula (1), using the measured load T (N), the mass M (kg) of the jig 41 and gravitational acceleration G (m/s²):

$$\mu=T/(G\times M) \quad (1).$$

The measurement is performed at three points apart from each other by 120° in the circumferential direction of the pipe, and an average value of the frictional coefficients μ at the three points is taken to be $\mu_i$.

The method of controlling the frictional coefficient to be in the foregoing range is not limited, and any method may be used. Generally, the frictional coefficient depends on the material and surface condition of the member. Accordingly, in one of the disclosed embodiments, the material, surface roughness, etc. of the spacer and the pipe in contact with the spacer may be controlled so that the frictional coefficient satisfies the foregoing condition. Specifically, at least one of the following (1) to (3) is preferably set to 0.8 mm or less:

(1) arithmetic mean roughness $Ra_s$ of the part of the surface of the spacer in contact with the straight pipe (2) arithmetic mean roughness $Ra_i$ of the outer surface of the inner straight pipe of the adjacent two straight pipes (3) arithmetic mean roughness $Ra_o$ of the inner surface of the outer straight pipe of the adjacent two straight pipes.

Even when at least one of $Ra_s$, $Ra_i$, and $Ra_o$ is 0.8 mm or less, there is a possibility that the foregoing condition of the frictional coefficient is not satisfied depending on the conditions such as material and surface treatment of the spacer and the straight pipe. In such a case, a method such as setting all of $Ra_s$, $Ra_i$, and $Ra_o$ to 0.8 mm or less, further reducing the arithmetic mean roughness, or changing the material of the spacer to a material having more lubricity may be used.

The arithmetic mean roughness may be measured at any position. Since the surface roughness of each of the spacer and the straight pipe produced by a typical method is substantially uniform, the arithmetic mean roughness measured at one point can be used as an index of the overall surface roughness. In the case where a welded steel pipe is used as the straight pipe, however, the arithmetic mean roughness is measured at a position other than the weld.

The material of the spacer may be any material, as long as the foregoing condition of the frictional coefficient is satisfied. In terms of low thermal conductivity and low friction coefficient, the material is preferably a resin, and more preferably a fluororesin. As the fluororesin, for example, one or more selected from the group consisting of polytetrafluoroethylene (PTFE), polyvinylidene fluoride (PVDF), polyvinyl fluoride (PVF), and polychlorotrifluoroethylene (PCTFE) may be used. To improve the strength of the spacer, a fiber reinforced plastic (FRP) obtained by adding a fibrous filler to the resin may be used. The FRP is, for example, a glass fiber reinforced plastic (GFRP). Other optional fillers may be added. However, if a filler is added, there is a possibility that the thermal conductivity of the spacer increases and the thermal insulation property decreases. Hence, the resin used for the spacer preferably does not contain a filler, in terms of thermal insulation property.

Diagonal Equivalent Length of Spacer

If the size of the spacer is approximately the same as the inside dimension of the pipe (for example, the outer pipe 11 in FIG. 1) with which the spacer is in internal contact, the thermal-insulated multi-walled pipe for superconducting power transmission cannot be bent well. Besides, when the thermal-insulated multi-walled pipe for superconducting power transmission is bent, the spacer may be damaged. Accordingly, the ratio ($L_d$/d) of the diagonal equivalent length $L_d$ of the polygon which is the cross-sectional shape of the spacer to the inner diameter d of the outer straight pipe of the adjacent two straight pipes is set to 0.9 or less. $L_d$/d is preferably 0.8 or less. The "diagonal equivalent length of the polygon" herein is defined as the length of the line segment having the maximum length from among the line segments each connecting a different pair of vertices of the polygon. For example, in the case where the polygon is a triangle, the diagonal equivalent length is the length of the longest side of the three sides. In the case where the polygon has four or more vertices, the diagonal equivalent length is the maximum diagonal line length.

Contact Portion

If the contact portion between the spacer and the pipe with which the spacer is in internal contact is excessively large, the sliding resistance between the spacer and the pipe increases, and the thermal insulation property decreases. Hence, the length $L_1$ of the contact portion between the spacer and the outer straight pipe of the adjacent two straight pipes in the longitudinal direction of the straight pipe is preferably 5 mm or less, more preferably 3 mm or less, and further preferably 1 mm or less.

Spacing

The spacers may be arranged at any spacing in the longitudinal direction of the thermal-insulated multi-walled pipe for superconducting power transmission. The spacing may be regular spacing or irregular spacing. The spacing is not limited, and may be any value. If the spacing is excessively large, the contact between the pipes constituting the multi-walled pipe may be unable to be prevented. The spacing is therefore preferably 10 m or less. If the spacing is excessively small, the spacer installation cost increases. The spacing is therefore preferably 1 m or more. Changes of the positions of the spacers in association with operation such as pipe laying are acceptable.

Stopper

If the spacer is movable in the longitudinal direction (axial direction) of the thermal-insulated multi-walled pipe for superconducting power transmission, the position of the spacer may greatly change due to operation such as laying, causing unintentional formation of a region where no spacer is present. To prevent this, a regulating member (stopper) that regulates the movement of the spacer in the longitudinal direction of the thermal-insulated multi-walled pipe for superconducting power transmission may be provided. The stopper may be any stopper capable of regulating the movement of the spacer. For example, a member fixed to one or both of the adjacent two straight pipes may be used as the stopper. The stopper need not necessarily prevent the movement of the spacer completely, and suffices to prevent the spacer from moving over the installation position of the stopper.

In a typical thermal-insulated multi-walled pipe for superconducting power transmission, a plurality of multi-walled pipes are connected by girth welding to achieve a desired length. Therefore, each pipe constituting the multi-walled pipe has, on its outer surface and inner surface, convex portions (weld beads) formed by welding at approximately regular spacing in the longitudinal direction. The movement of the spacer is regulated by such convex portions, and thus the provision of the stopper is optional.

[Laying Method]

The thermal-insulated multi-walled pipe for superconducting power transmission may be laid by any method, but is particularly suitable for laying on the sea bottom using a reel barge. The laying using a reel barge can be performed according to a method used when laying line pipes and the like.

In the laying, a vacuum insulation layer is formed by exhausting (vacuuming) the space between the adjacent two straight pipes, i.e. the space in which the spacers are arranged. The exhaustion may be performed once after laying the thermal-insulated multi-walled pipe for superconducting power transmission, or performed twice or more. For example, preliminary exhaustion (provisional vacuuming) is performed before laying, and exhaustion to the final vacuum (main vacuuming) is performed after laying.

REFERENCE SIGNS LIST 1 thermal-insulated multi-walled pipe for superconducting power transmission
10 double pipe (multi-walled pipe)
11 outer pipe
12 inner pipe
13 space (for coolant)
14 space (vacuum insulation layer)
20 superconducting cable
30 spacer
31 through-hole (for superconducting cable installation)
32 through-hole (for heat conduction prevention)
41 jig
42 spring scale

The invention claimed is:

1. A thermal-insulated multi-walled pipe for superconducting power transmission, comprising:
   a superconducting cable;
   a multi-walled pipe that is composed of a plurality of straight pipes and houses the superconducting cable; and
   a plurality of spacers that are located between adjacent two straight pipes of the plurality of straight pipes,
   wherein a cross-sectional shape of each of the plurality of spacers in a plane perpendicular to a longitudinal direction of the thermal-insulated multi-walled pipe for superconducting power transmission is a polygon having three or more vertices,
   each of the plurality of spacers has a through-hole at a center in the plane perpendicular to the longitudinal direction of the thermal-insulated multi-walled pipe for superconducting power transmission,
   an inner straight pipe of the adjacent two straight pipes is located to pass through the through-hole,
   a frictional coefficient $\mu_i$ between each of the plurality of spacers and the inner straight pipe of the adjacent two straight pipes is 0.1 or less,
   a frictional coefficient $\mu_o$ between each of the plurality of spacers and an outer straight pipe of the adjacent two straight pipes is 0.1 or less, and
   a ratio $L_d/d$ of a diagonal equivalent length $L_d$ of the polygon to an inner diameter d of the outer straight pipe of the adjacent two straight pipes is 0.8 or less in the case where the polygon has three vertices, and is 0.9 or less in the case where the polygon has four or more vertices.

2. The thermal-insulated multi-walled pipe for superconducting power transmission according to claim 1, wherein a length $L_1$ of a contact portion between each of the plurality of spacers and the outer straight pipe of the adjacent two straight pipes in a longitudinal direction of the straight pipe is 5 mm or less.

3. The thermal-insulated multi-walled pipe for superconducting power transmission according to claim 1, wherein a total thickness of the plurality of straight pipes constituting the multi-walled pipe is 10 mm or more.

4. The thermal-insulated multi-walled pipe for superconducting power transmission according to claim 1, wherein an innermost pipe of the plurality of straight pipes is made of a steel material whose volume fraction of austenite phase is 80% or more.

5. The thermal-insulated multi-walled pipe for superconducting power transmission according to claim 1, wherein at least one of the plurality of straight pipes has a plated layer.

6. A laying method for a thermal-insulated multi-walled pipe for superconducting power transmission, comprising laying the thermal-insulated multi-walled pipe for superconducting power transmission according to claim 1 on a sea bottom using a reel barge.

7. The thermal-insulated multi-walled pipe for superconducting power transmission according to claim 1, wherein the cross-sectional shape of each of the plurality of spacers is a polygon having three vertices.

8. The thermal-insulated multi-walled pipe for superconducting power transmission according to claim 1, wherein the cross-sectional shape of each of the plurality of spacers is a polygon having four or more vertices.

* * * * *